United States Patent
Kouma et al.

(10) Patent No.: US 9,917,239 B2
(45) Date of Patent: Mar. 13, 2018

(54) THERMOELECTRIC CONVERSION DEVICE AND ELECTRONIC DEVICE

(71) Applicant: FUJITSU LIMITED, Kawasaki-shi, Kanagawa (JP)

(72) Inventors: Norinao Kouma, Atsugi (JP); Osamu Tsuboi, Kawasaki (JP); Takuya Nishino, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 395 days.

(21) Appl. No.: 14/678,548

(22) Filed: Apr. 3, 2015

(65) Prior Publication Data
US 2015/0214459 A1    Jul. 30, 2015

Related U.S. Application Data

(63) Continuation of application No. PCT/JP2012/076213, filed on Oct. 10, 2012.

(51) Int. Cl.
*H02J 7/00* (2006.01)
*H01M 10/44* (2006.01)
(Continued)

(52) U.S. Cl.
CPC .......... *H01L 35/32* (2013.01); *H01M 10/052* (2013.01); *H01M 16/00* (2013.01); *H02J 7/0052* (2013.01)

(58) Field of Classification Search
CPC ....... H01L 35/32; H01L 35/325; H01L 35/28; H01L 35/30; H01L 35/02; H01L 35/04;
(Continued)

(56) References Cited

U.S. PATENT DOCUMENTS 5,065,085 A  *  11/1991  Aspden ................... H01L 35/32
                                                        310/306
6,274,803 B1     8/2001  Yoshioka et al.
(Continued)

FOREIGN PATENT DOCUMENTS

JP    2000-150971    5/2000
JP    2001-119076    4/2001
(Continued)

OTHER PUBLICATIONS

International Search Report dated Jan. 8, 2013 in corresponding International Patent Application No. PCT/JP2012/076213.
(Continued)

*Primary Examiner* — Drew A Dunn
*Assistant Examiner* — Michael Dibenedetto
(74) *Attorney, Agent, or Firm* — Staas & Halsey LLP

(57) ABSTRACT

A thermoelectric conversion device includes: a thermoelectric conversion element in which a p-type thermoelectric material and an n-type thermoelectric material that are provided between an upper electrode and a lower electrode of the thermoelectric conversion element are alternately connected in series via the upper electrode and the lower electrode; an insulating layer that is provided between the upper electrode and the lower electrode and covers the p-type thermoelectric material and the n-type thermoelectric material; and an electric storage element that is provided between the upper electrode and the lower electrode and is covered by the insulating layer.

15 Claims, 10 Drawing Sheets

(51) Int. Cl.
  *H01L 35/28* (2006.01)
  *H01L 35/32* (2006.01)
  *H01M 10/052* (2010.01)
  *H01M 16/00* (2006.01)

(58) Field of Classification Search
  CPC ......... H01L 35/10; H01L 35/00; H01L 37/00; G01K 7/02; H02J 7/0042; H02J 7/0045
  USPC .......................... 136/224, 205, 206; 320/101
  See application file for complete search history.

(56) References Cited

U.S. PATENT DOCUMENTS

| | | | |
|---|---|---|---|
| 2004/0059212 A1* | 3/2004 | Abreu | A61B 5/01 600/373 |
| 2007/0290331 A1* | 12/2007 | Quarre | H01L 31/024 257/713 |
| 2008/0001577 A1* | 1/2008 | Sather | B60C 23/0411 320/162 |
| 2009/0001577 A1* | 1/2009 | Kim | H01L 21/76843 257/751 |
| 2009/0272459 A1 | 11/2009 | Biaggi | |
| 2011/0290295 A1* | 12/2011 | Veerasamy | H01L 31/048 136/224 |
| 2013/0015549 A1* | 1/2013 | Fornara | H01L 27/16 257/467 |

FOREIGN PATENT DOCUMENTS

| | | |
|---|---|---|
| JP | 2006-301711 | 11/2006 |
| JP | 2009-541114 | 11/2009 |
| WO | WO 2009/063805 | 5/2009 |

OTHER PUBLICATIONS

Written Opinion of the International Searching Authority dated Jan. 8, 2013 in corresponding International Application No. PCT/JP2012/076213.

* cited by examiner

THERMOELECTRIC CONVERSION DEVICE AND ELECTRONIC DEVICE

CROSS-REFERENCE TO RELATED APPLICATION

This application is a continuation application of PCT/JP2012/076213 filed on Oct. 10, 2012 and designated the U.S., the entire contents of which are incorporated herein by reference.

FIELD

A certain aspect of embodiments described herein relates to a thermoelectric conversion device and an electronic device.

BACKGROUND

Recently, thermoelectric conversion devices using a MEMS (Micro Electro Mechanical System) technology are being focused. Applying the thermoelectric conversion devices to a mobile type of micro energy source, a local cooling device or a sensor is being studied. Thermoelectric conversion devices having an electric storage element for storing electrical power is being known (for example, see International Publication No. 2009/063805 hereinafter referred to as Document 1).

SUMMARY

According to an aspect of the present invention, there is provided a thermoelectric conversion device including: a thermoelectric conversion element in which a p-type thermoelectric material and an n-type thermoelectric material that are provided between an upper electrode and a lower electrode of the thermoelectric conversion element are alternately connected in series via the upper electrode and the lower electrode; an insulating layer that is provided between the upper electrode and the lower electrode and covers the p-type thermoelectric material and the n-type thermoelectric material; and an electric storage element that is provided between the upper electrode and the lower electrode and is covered by the insulating layer.

According to another aspect of the present invention, there is provided an electronic device including: the thermoelectric conversion device; and an electronic element to which an electrical power is supplied from the thermoelectric conversion device.

DESCRIPTION OF EMBODIMENTS

When a thermoelectric conversion element is downsized, a heat resistance of the thermoelectric conversion element is reduced. It is therefore difficult to apply a large temperature difference to a thermocouple. Downsizing also causes a reduction of the number of series connections of thermocouples. It is therefore difficult to enlarge electromotive force. For example, in a thermoelectric conversion device having an electric storage element disclosed in Document 1, the electric storage element is provided on a thermoelectric conversion element. It is therefore difficult to apply a large temperature difference to a thermocouple. For example, when the temperature difference applied to the thermocouple is reduced to a half (½), the electromotive force of the thermoelectric conversion element is reduced to a half (½) and electrical power is reduced to a quarter (¼).

First Embodiment

Figure 1:
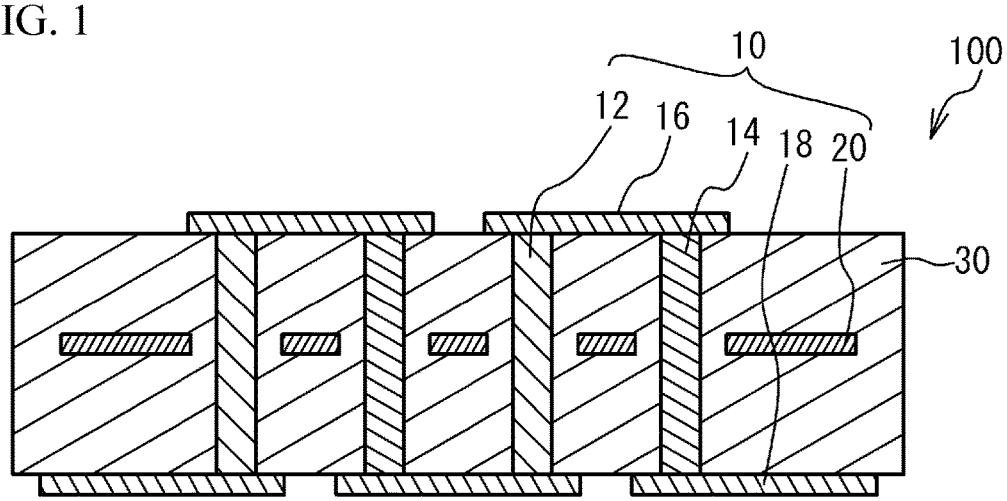
FIG. 1 illustrates a cross sectional view of a thermoelectric conversion device in accordance with a first embodiment.

FIG. 1 illustrates a cross sectional view of a thermoelectric conversion device in accordance with a first embodiment. A thermoelectric conversion device 100 has thermoelectric conversion elements 10, an electric storage element 20 and an insulating layer 30. Each of the thermoelectric conversion elements 10 has an n-type thermoelectric material 12, a p-type thermoelectric material 14, an upper electrode 16 and a lower electrode 18. The p-type thermoelectric material 14 and the n-type thermoelectric material 12 are provided between the upper electrode 16 and the lower electrode 18. For example, the p-type thermoelectric material 14 and the n-type thermoelectric material 12 have a column shape. A temperature difference between the upper electrode 16 and the lower electrode 18 causes electromotive force in the n-type thermoelectric material 12 and the p-type thermoelectric material 14. A plurality of the n-type thermoelectric materials 12 and a plurality of the p-type thermoelectric materials 14 are alternately connected in series via the upper electrodes 16 and the lower electrodes 18. With the structure, large electromotive force can be generated.

The insulating layer 30 is provided between the upper electrodes 16 and the lower electrodes 18 and covers the p-type thermoelectric materials 14 and the n-type thermoelectric materials 12. The insulating layer 30 strengthens the p-type thermoelectric materials 14 and the n-type thermoelectric materials 12. The insulating layer 30 protects the p-type thermoelectric materials 14, the n-type thermoelectric materials 12 and the electric storage element 20 from mechanical impact and/or chemical deterioration during manufacturing and/or using thereof. It is preferable that mechanical intensity of the insulating layer 30 is large. It is preferable that electrical resistivity of the insulating layer 30 is larger than that of the p-type thermoelectric materials 14 and the n-type thermoelectric materials 12 in terms of electrically separating the p-type thermoelectric materials 14 from the n-type thermoelectric materials 12. Moreover, it is preferable that a thermal conductivity of the insulating layer 30 is smaller than that of the p-type thermoelectric materials 14 and the n-type thermoelectric materials 12 in terms of enlarging a temperature difference between the upper electrode 16 and the lower electrode 18.

The electric storage element 20 is provided between the upper electrodes 16 and the lower electrodes 18 and are covered with the insulating layer 30. The electric storage element 20 is, for example, a solid secondary cell and stores electrical power generated by the thermoelectric conversion elements.

In the first embodiment, the electric storage element 20 is provided between the upper electrodes 16 and the lower electrodes 18. Therefore, the temperature difference between the upper electrodes 16 and the lower electrodes 18 can be enlarged more than a case where an electric storage element is provided on a thermoelectric conversion element. It is therefore possible to enlarge electromotive force generated by the thermoelectric conversion elements 10. And, the insulating layer 30 can strengthen the p-type thermoelectric materials 14, the n-type thermoelectric materials 12 and the electric storage element 20. It is preferable that the insulating layer 30 covers all of the side faces of the p-type thermoelectric materials 14 and the n-type thermoelectric materials 12 in terms of strengthening. Moreover, the insulating layer 30 can seal the electric storage element 20. Moreover, the thermoelectric conversion device 100 can be downsized because at least a part of the electric storage element 20 is provided between the p-type thermoelectric material 14 and the p-type thermoelectric material 12.

Second Embodiment

Figure 2A:
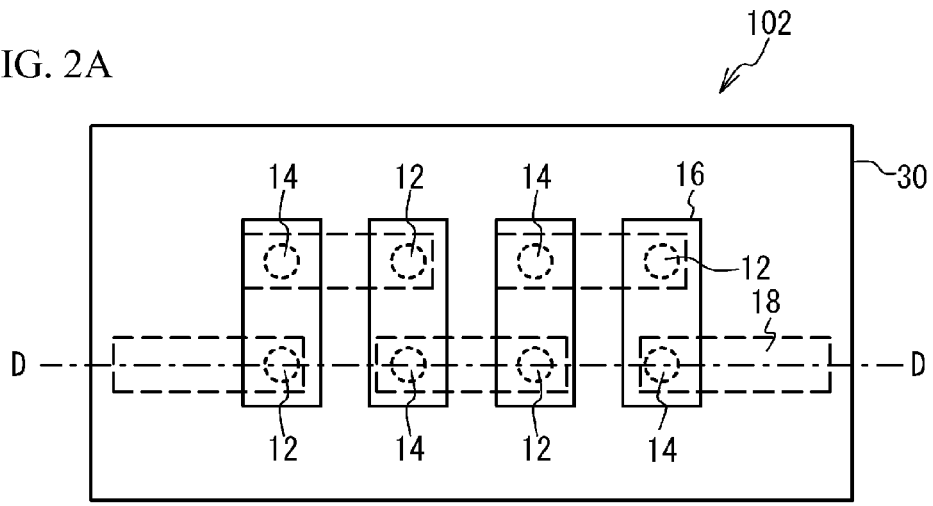
FIG. 2A illustrates a plane view of a thermoelectric conversion device in accordance with a second embodiment.
Figure 2B:
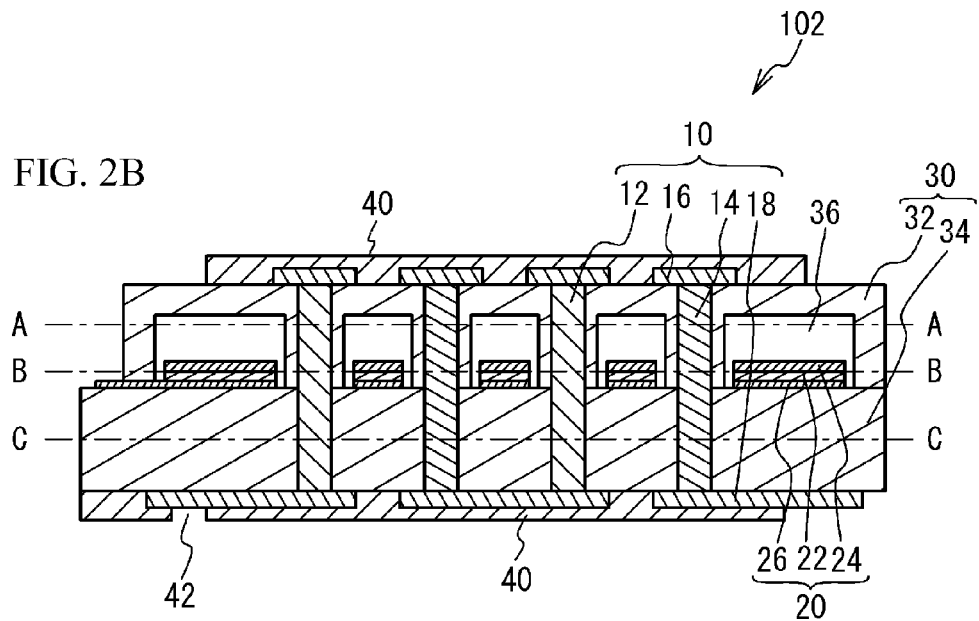
FIG. 2B illustrates a cross sectional view taken along a line D-D of FIG. 2A.
Figure 3A:
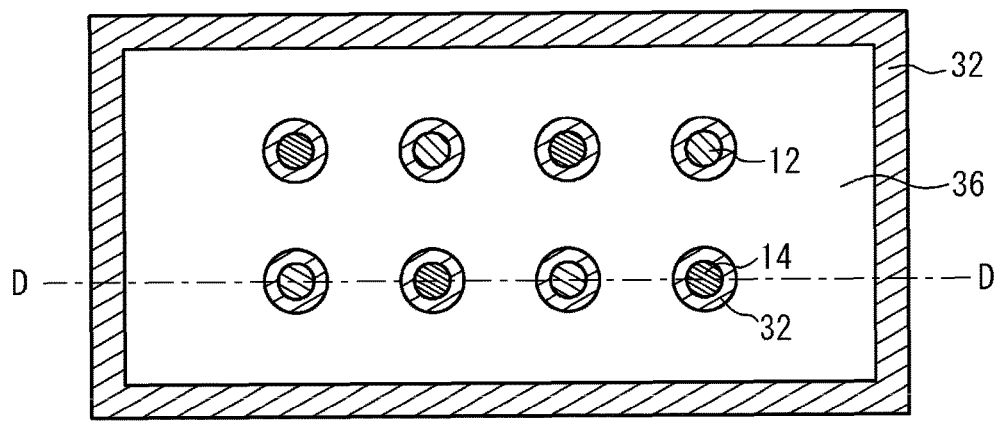
FIG. 3A and FIG. 3B respectively illustrate cross sectional views taken along a line A-A and a line B-B of FIG. 2B.
Figure 3B:
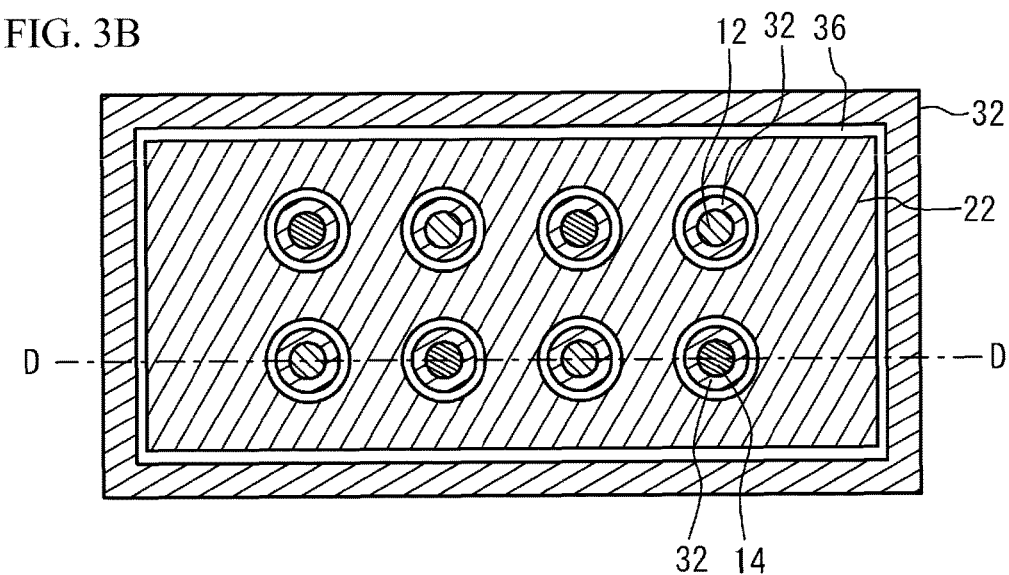
Figure 4:
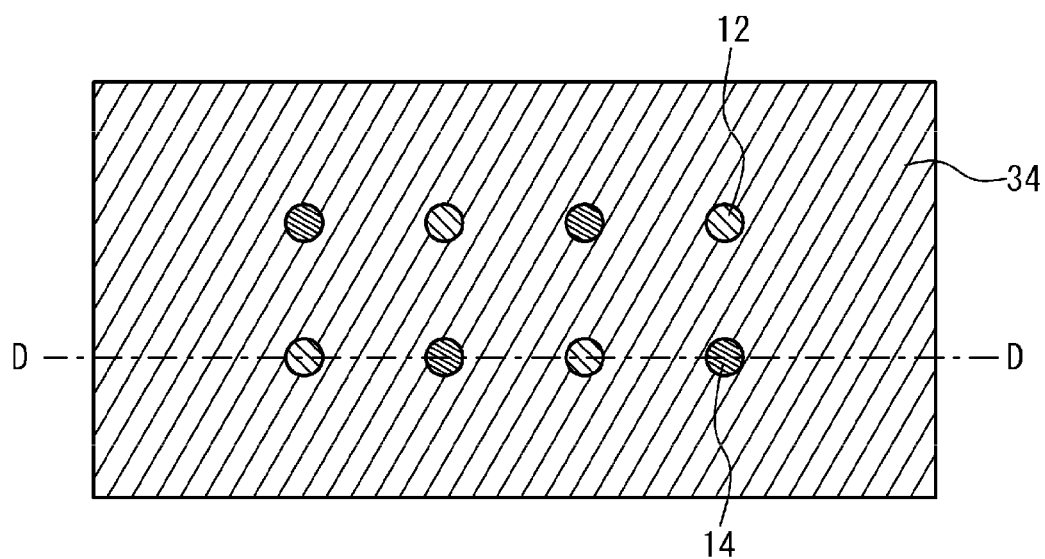
FIG. 4 illustrates a cross sectional view taken along a line C-C of FIG. 2B.

FIG. 2A illustrates a plane view of a thermoelectric conversion device in accordance with a second embodiment. FIG. 2B illustrates a cross sectional view taken along a line D-D of FIG. 2A. In FIG. 2A, the n-type thermoelectric materials 12, the p-type thermoelectric materials 14, the upper electrodes 16, the lower electrodes 18 and the insulating layer 30 are illustrated. FIG. 3A, FIG. 3B and FIG. 4 respectively illustrate cross sectional views taken along a line A-A, taken along a line B-B and taken along a line C-C of FIG. 2B.

As illustrated in FIG. 2A, in a thermoelectric conversion device 102, a plurality of combinations of the lower electrode 18, the p-type thermoelectric material 14, the upper electrode 16, the n-type thermoelectric material 12 and the lower electrode 18 are connected in series. It is possible to enlarge electromotive force by enlarging the number of series connections. As illustrated in FIG. 2B, the p-type thermoelectric materials 14 and the n-type thermoelectric materials 12 have a circular column shape, a rectangular column shape or the like. Lower faces of the p-type thermoelectric materials 14 and the n-type thermoelectric materials 12 are electrically in touch with the lower electrodes 18. Upper faces of the p-type thermoelectric materials 14 and the n-type thermoelectric materials 12 are electrically in touch with the upper electrodes 16. The upper electrodes 16 and the lower electrodes 18 are covered with protective films 40. The protective films 40 are insulating materials protecting the upper electrodes 16 and the lower electrodes 18. Each of the protective films 40 has an opening 42 through which the upper electrode 16 and/or the lower electrode 18 are exposed. The upper electrodes 16 and/or the lower electrodes 18 can be electrically connected via the opening 42. The insulating layer 30 has a structure in which a first insulating layer 34 is adhered to a second insulating layer 32. An upper face of the first insulating layer 34 is flat. A lower face of the second insulating layer 32 has a recess. A cavity 36 is formed in the recess under a condition that the first insulating layer 34 and the second insulating layer 32 are adhered to each other. The electric storage element 20 is provided in the cavity 36. The electric storage element 20 has a positive electrode 26, a negative electrode 24 and a solid electrolyte 22.

As illustrated in FIG. 3A, the second insulating layer 32 is provided around the p-type thermoelectric materials 14 and the n-type thermoelectric materials 12. The cavity 36 is formed in the other region. As illustrated in FIG. 3B, the electric storage element (in FIG. 3B, the solid electrolyte 22 of the electric storage element is illustrated) is provided in the cavity 36. The electric storage element has through holes. The p-type thermoelectric material 14 and the n-type thermoelectric material 12 respectively penetrate the through hole. Thus, an area of the electric storage element can be enlarged. As illustrated in FIG. 4, the p-type thermoelectric materials 14 and the n-type thermoelectric materials 12 are buried in the first insulating layer 34. The cavity 36 may be divided into a plurality of regions. The electric storage element may be divided into a plurality of parts.

A diameter of a horizontal cross section of the p-type thermoelectric materials 14 and the n-type thermoelectric materials 12 is, for example, 5 μm to 100 μm. The diameter may be 50 μm, for example. A height of the p-type thermoelectric materials 14 and the n-type thermoelectric materials 12 is, for example, 50 μm to 500 μm. The height may be 300 μm, for example. An aspect ratio of the diameter and the height is, for example, 2 to 40. When the diameter is small, a high density can be achieved. However, the diameter is excessively small, mechanical strength gets weaker and a processing gets more difficult. When the height is large, large electromotive force can be achieved. However, the height is excessively large, the mechanical strength gets weaker. In order to secure the mechanical strength of the p-type thermoelectric materials 14 and the p-type thermoelectric materials 12, a diameter of regions of the p-type thermoelectric materials 14 and the n-type thermoelectric materials 12 that are in touch with the upper electrode 16 and the lower electrode 18 may be enlarged. For example, the diameter may be larger than a minimum diameter by 1 μm to 20 μm (for example, 5 μm).

The p-type thermoelectric material 14 is, for example, a p-type semiconductor material such as $Bi_{0.3}Sb_{1.7}Te_3$, an oxide thermoelectric material (for example $Ca_3Co_4O_9$ or the like), a silicide ($MnSi_{1.7}$), or skutterudite or the like. The n-type thermoelectric material 12 is, for example, an n-type semiconductor material such as $Bi_2Te_3$, an oxide thermoelectric material (for example $Na_xCoO$ or AZO or the like), a silicide ($Mg_2Si$) or skutterudite or the like. The insulating layer 30 may be a photosensitive glass. Although the insulating layer 30 may be an organic material such as resin, it is preferable that the insulating layer 30 is an inorganic material in terms of heat resistance. The photosensitive glass may be PEG3 (made by HOYA). A thickness of the first insulating layer 34 and the second insulating layer 32 may be 400 μm or the like. A height of the cavity 36 may be 50 μm. A width of the cavity 36 may be 50 μm.

The electric storage element 20 is, for example, a solid lithium secondary cell. The positive electrode 26 is, for example, lithium cobaltate (LiCoO$_2$) having a thickness of 100 nm. The negative electrode 24 is, for example, metal lithium having a thickness of 100 nm. The solid electrolyte 22 is, for example, a sulfide material having a thickness of 1 µm. Moisture causes deterioration of the material of the negative electrode 24 and the solid electrolyte 22. It is therefore preferable that the cavity 36 is vacuum or is filled with inert gas (such as nitrogen or noble gas). In the case of other than the solid lithium secondary cell, it is preferable that the cavity 36 is vacuum or is filled with inert gas in order to seal the electric storage element 20.

The upper electrode 16 and the lower electrode 18 have a metal structure such as a lamination film in which Ti and Au are laminated from the side in touch with the p-type thermoelectric material 14 and the n-type thermoelectric material 12, or a lamination film in which Ti and Cu are laminated from the side in touch with the p-type thermoelectric material 14 and the n-type thermoelectric material 12. It is preferable that a material of the protective film 40 has high thermal conductivity and high electrical resistivity. For example, the protective film 40 may be aluminum nitride, aluminum oxide, parylene or resin.

Figure 5A:
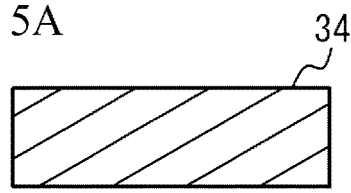
FIG. 5A to FIG. 5E illustrate cross sectional views for describing a manufacturing method of a thermoelectric conversion device in accordance with a second embodiment.
Figure 5A:
Figure 5B:
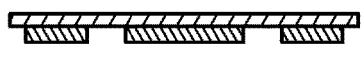
Figure 5B:
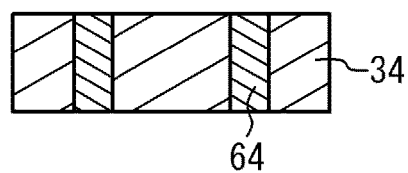
Figure 5B:
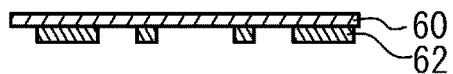
Figure 5C:
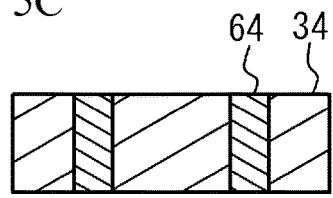
Figure 5C:
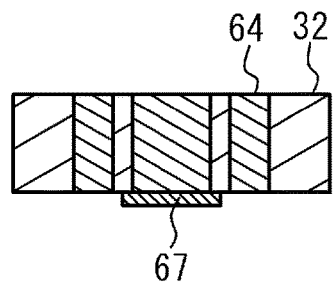

FIG. 5A to FIG. 6E illustrate cross sectional views for describing a manufacturing method of the thermoelectric conversion device in accordance with the second embodiment. As illustrated in FIG. 5A, two photosensitive glass substrates are prepared as the first insulating layer 34 and the second insulating layer 32. As illustrated in FIG. 5B, the first insulating layer 34 and the second insulating layer 32 are subjected to an ultraviolet exposure with use of a mask 60 having light-blocking members 62 such as chrome. For example, a thermal process is performed for one hour at 500 degrees C., and a thermal process is performed for two hours at 590 degrees C. Thus, altered regions 64 are formed in the regions where the ultraviolet light is radiated. As illustrated in FIG. 5C, a pattern of a photo resist 67 is formed in a region in which a cavity of the second insulating layer 32 is formed.

Figure 5D:
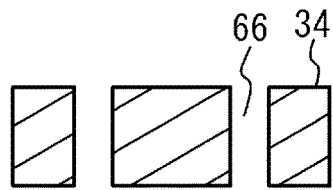
Figure 5D:
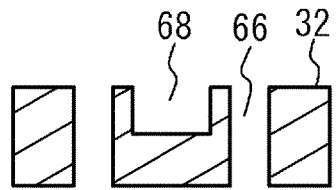
Figure 5E:
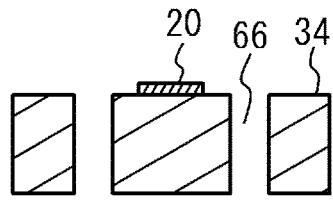
Figure 5E:
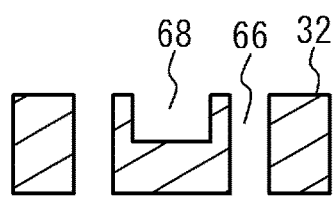

As illustrated in FIG. 5D, the first insulating layer 34 and the second insulating layer 32 are intruded into hydrofluoric acid that is diluted with pure water. Thus, the altered regions 64 are etched, and through holes 66 are formed. The hydrofluoric acid does not intrude into the region having the photo resist 67 is formed on one face thereof. Therefore, a recess 68 is formed. After that, the photo resist 67 is removed. The through hole 66 and the recess 68 may be formed separately by performing two etchings. As illustrated in FIG. 5E, the electric storage element 20 is formed on the first insulating layer 34. The electric storage element 20 may be formed by forming the positive electrode, the solid electrolyte and the negative electrode by a sputtering method with use of a stencil mask.

Figure 6A:
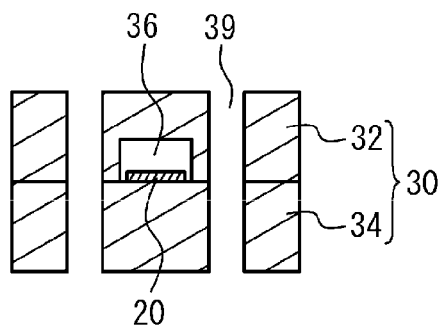
FIG. 6A to FIG. 6E illustrate cross sectional views for describing a manufacturing method of a thermoelectric conversion device in accordance with a second embodiment.

As illustrated in FIG. 6A, the first insulating layer 34 is jointed to the second insulating layer 32 so that the through hole 66 of the first insulating layer 34 and the through hole 66 of the second insulating layer 32 communicate with each other, thereby, a through hole 39 is formed, and the cavity 36 is formed on the electric storage element 20. In the jointing of the first insulating layer 34 and the second insulating layer 32, a glass frit method may be used. As illustrated in FIG. 6B, the through holes 39 are filled with the p-type thermoelectric material 14 and the n-type thermoelectric material 12. The p-type thermoelectric material 14 and the n-type thermoelectric material 12 are Bi$_{0.3}$Sb$_{1.7}$Te$_3$ and Bi$_2$Te$_3$ having a grain diameter of 200 nm or the like. For example, the through holes 39 are filled with the p-type thermoelectric material 14 and the n-type thermoelectric material 12 by an aerosol deposition method. The aerosol deposition method is appropriate for filling a micro opening having a high aspect ratio with a powder material. When the p-type thermoelectric material 14 is filled, the through hole 39 for the n-type thermoelectric material 12 is protected with use of a stencil mask. When the n-type thermoelectric material 12 is filled, the through hole 39 for the p-type thermoelectric material 14 is protected with use of a stencil mask. The stencil mask is made from a silicon substrate in advance. After that, a thermal process and/or a pressing is performed, and a thermoelectric characteristic of the p-type thermoelectric material 14 and the n-type thermoelectric material 12 is improved. For example, the p-type thermoelectric material 14 and the n-type thermoelectric material are subjected to a thermal process in inert gas atmosphere at 400 degrees C. for one hour. After that, the upper face and the lower face of the insulating layer 30 are grinded and flattened. When the opening of the through hole 39 is large or the aspect ratio of the through hole 39 is small, a hot press method may be used instead of the aerosol deposition method.

Figure 6C:
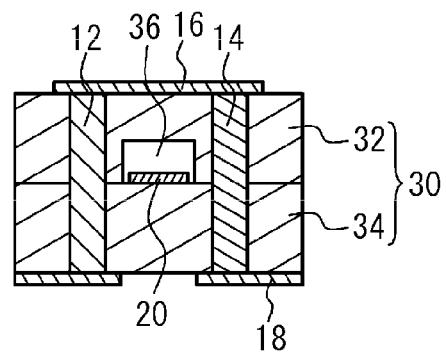
Figure 6B:
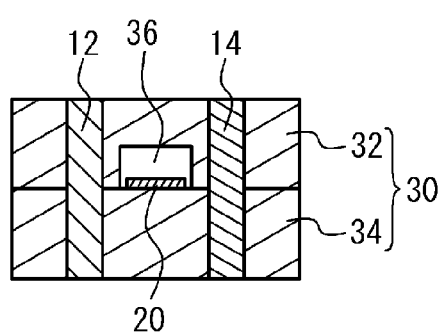
Figure 6D:
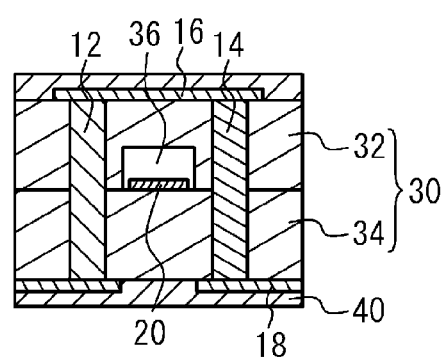
Figure 6E:
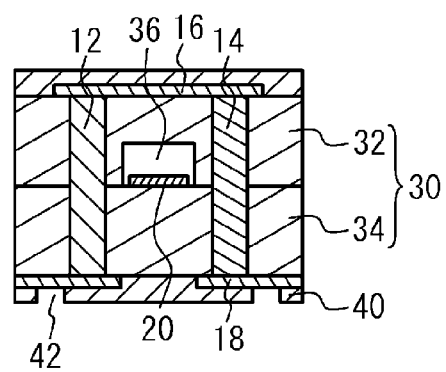

As illustrated in FIG. 6C, the lower electrodes 18 are formed on the lower face of the insulating layer 30. And, the upper electrodes 16 are formed on the upper face of the insulating layer 30. A sputtering method, a vacuum deposition method, or an inkjet printing method may be used for forming the lower electrodes 18 and the upper electrodes 16. As illustrated in FIG. 6D, the protective film 40 is formed on the upper face and the lower face of the insulating layer 30 so as to cover the lower electrodes 18 and the upper electrodes 16. A sputtering method or a CVD (Chemical Vapor Deposition) method may be used for forming the protective film 40. As illustrated in FIG. 6E, the openings 42 are formed in the protective film 40 so as to expose the lower electrodes 18 and/or the upper electrodes 16.

Figure 7A:
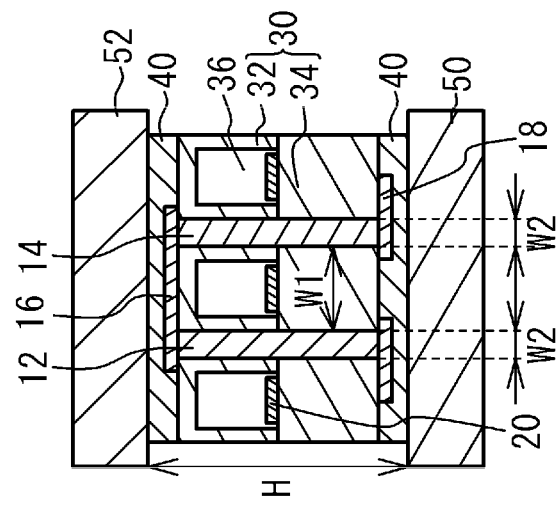
FIG. 7A to FIG. 7C illustrate schematic cross sectional views of a comparative example, a first embodiment and a second embodiment used for a simulation.
Figure 7B:
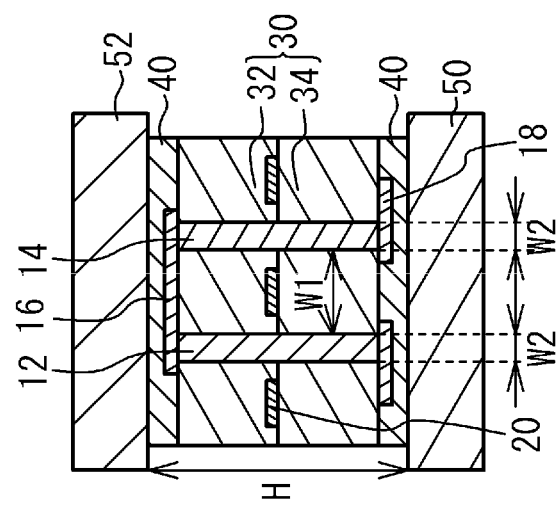
Figure 7C:
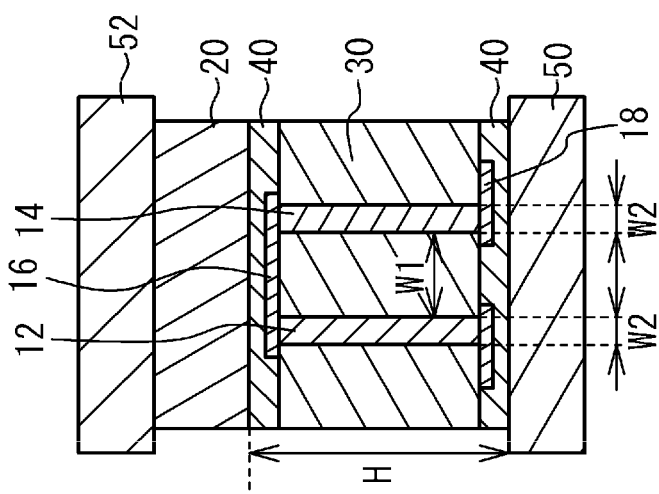

Next, the temperature difference between the upper electrode 16 and the lower electrode 18 of the second embodiment was simulated. FIG. 7A to FIG. 7C illustrate schematic cross sectional views of the comparative example, the first embodiment and the second embodiment used for the simulation. As illustrated in FIG. 7A to FIG. 7C, a thermoelectric conversion device is located between a heat source 50 and a heat sink 52. As illustrated in FIG. 7A, in the comparative example, the electric storage element 20 is provided on the thermoelectric conversion element. As illustrated in FIG. 7B, in the first embodiment, the electric storage element 20 is provided in the insulating layer 30. As illustrated in FIG. 7C, in the second embodiment, the cavity 36 is formed in the insulating layer 30. A volume of the cavity 36 is ¼ of that of the insulating layer 30.

Conditions of the simulation are as follows.
Temperature difference between the heat source 50 and the heat sink 52: 10K
Heat resistance of the electric storage element 20: 20K/W
Heat resistance of the heat sink 52: 20K/W
Thickness H of the thermoelectric conversion device: 400 µm
Area of the thermoelectric conversion device: 1 cm$^2$
Diameter W2 of the thermoelectric materials 12 and 14: 50 µm
Thermal conductivity of the thermoelectric materials 12 and 14: 1.5 (W/m/K)
Thermal conductivity of the insulating layer 30: 0.8 (W/m/K)
Thermal conductivity of the cavity 36: 0.02 (W/m/K)
The upper electrode 16, the lower electrode 18 and the protective film 40 are ignored.

Figure 8:
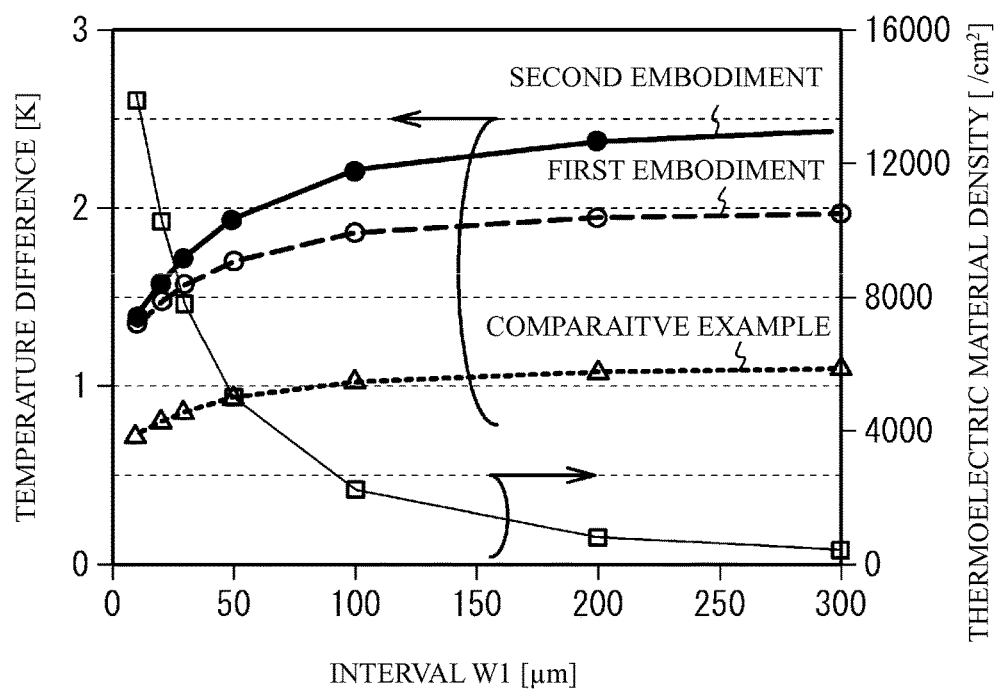
FIG. 8 illustrates a temperature difference between an upper face and a lower face of a thermoelectric conversion device with respect to an interval W1 between thermoelectric materials 12 and 14.

FIG. 8 illustrates a temperature difference between the upper face and the lower face of the thermoelectric conversion device with respect to an interval W1 between the thermoelectric materials 12 and 14. Moreover, FIG. 8 illustrates a density of the thermoelectric material per a unit area with respect to the interval W1. As illustrated in FIG. 8, when the interval W1 is small, the density of the thermoelectric materials 12 and 14 gets larger. On the other hand, the temperature difference gets smaller when the interval W1 is small. This is because the heat conductivity of the thermoelectric materials 12 and 14 is larger than that of the insulating layer 30. The temperature difference of the first embodiment is larger than that of the comparative example. This is because the electric storage element 20 is provided between the upper electrode 16 and the lower electrode 18. Moreover, the temperature difference of the second embodiment is larger than that of the first embodiment. This is because the cavity 36 is formed in the insulating layer 30.

In the second embodiment, at least a part of the electric storage element 20 is exposed to the cavity 36 that is formed between the p-type thermoelectric materials 14 and the n-type thermoelectric materials 12. Thus, the temperature difference between the upper electrode 16 and the lower electrode 18 can be enlarged. Moreover, the cavity 36 can seal the electric storage element 20.

The insulating layer 30 has the first insulating layer 34 and the second insulating layer 32. The first insulating layer 34 has a flat face on which the electric storage element 20 is mounted. The second insulating layer 32 has a face that is jointed to the flat face of the first insulating layer 34 and has a recess for forming the cavity 36. Thus, as illustrated in FIG. 5E and FIG. 6A, it is easy to locate the electric storage element 20 in the cavity 36.

Figure 9:
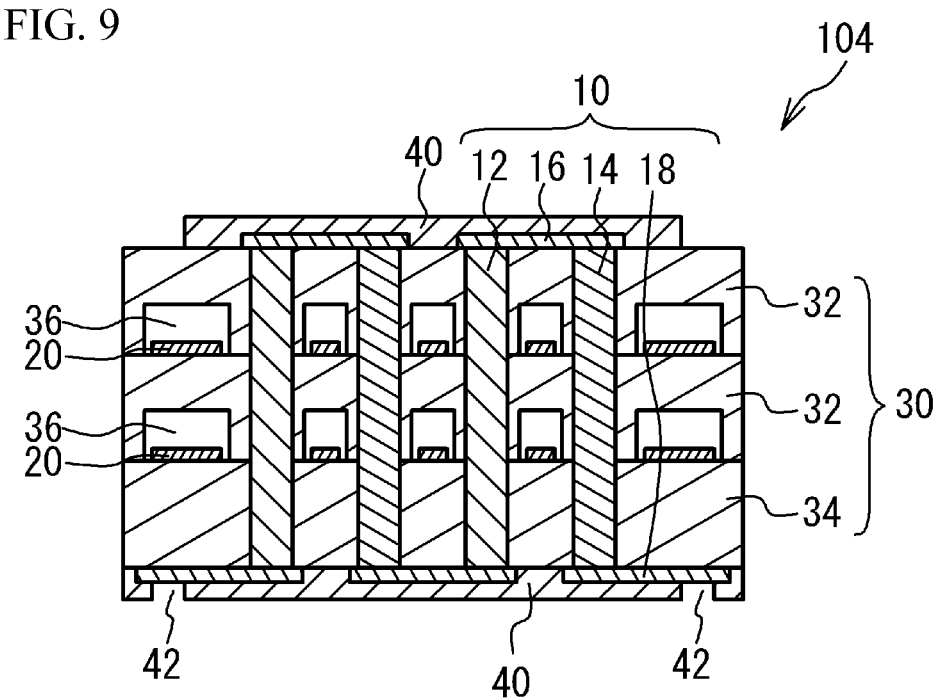
FIG. 9 illustrates a cross sectional view of a thermoelectric conversion device in accordance with a modified embodiment of a second embodiment.

FIG. 9 illustrates a cross sectional view of a thermoelectric conversion device in accordance with a modified embodiment of the second embodiment. As illustrated in FIG. 9, a thermoelectric conversion device 104 has a plurality of the second insulating layers 32. The cavity 36 is formed in the second insulating layer 32. The electric storage element 20 is provided in the cavity 36. In this manner, two or more second insulating layers 32 may be laminated, and two or more electric storage elements 20 may be laminated. Other structures are the same as the second embodiment. Therefore, an explanation of the other structures is omitted. A manufacturing method of the modified embodiment of the second embodiment is the same as that of the second embodiment. Therefore, an explanation of the manufacturing method is omitted.

For example, when the electric storage element 20 is a solid secondary cell, it is preferable that the electric storage element 20 is sealed in the cavity 36 in order to suppress deterioration caused by moisture. For example, when the solid secondary cell is a solid lithium secondary cell having a solid electrolyte, deterioration caused by moisture especially tends to occur. It is therefore preferable that the electric storage element 20 is sealed in the cavity 36.

Third Embodiment

Figure 10:
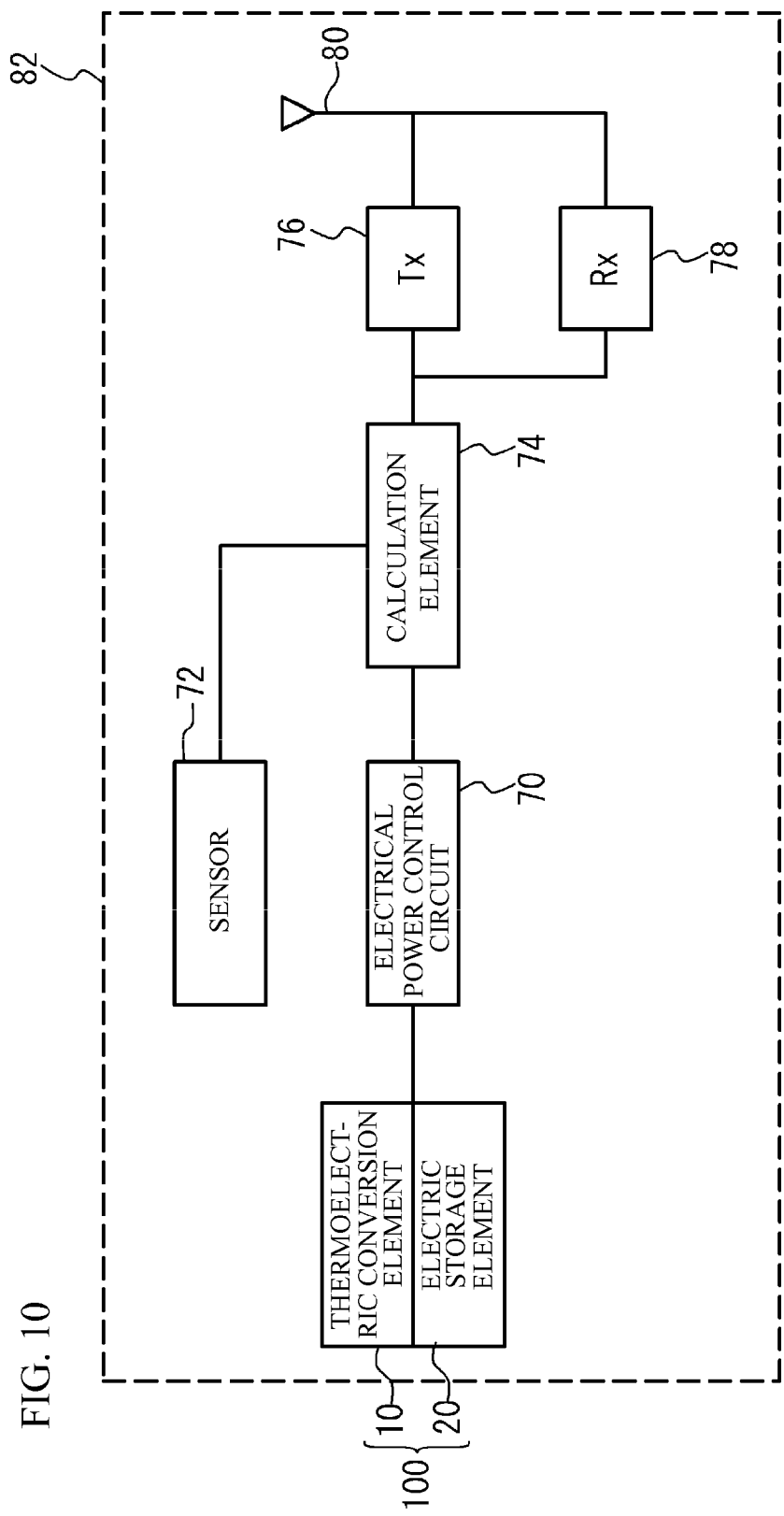
FIG. 10 illustrates a block diagram of an electronic device in accordance with a third embodiment.

A third embodiment is an example of an electronic device in which the thermoelectric conversion element of the first embodiment or the second embodiment is used. FIG. 10 illustrates a block diagram of an electronic device in accordance with a third embodiment. A description will be given of a compound sensor device as an electronic device. As illustrated in FIG. 10, a compound sensor device 82 has the thermoelectric conversion device 100, an electrical power control circuit 70, a sensor 72, a calculation element 74, a transmit circuit (Tx) 76, a receive circuit (Rx) 78 and an antenna 80. The thermoelectric conversion device 100 is the thermoelectric device of the first embodiment or the second embodiment and has the thermoelectric conversion element 10 and the electric storage element 20. The thermoelectric conversion element 10 generates electrical power from exhaust heat or a body temperature for example. The electric storage element 20 stores the electrical power generated by the thermoelectric conversion element 10. The electrical power control circuit 70 controls electrical power supplied to the sensor 72, the calculation element 74, the transmit circuit 76 and the receive circuit 78. The sensor 72 detects a sensed amount. The sensed amount is such as a temperature, a moisture content or a heart rate or the like. The calculation element 74 calculates an output of the sensor 72. The calculation element 74 gives an instruction to the sensor 72 and the electrical power control circuit 70 in accordance with instruction information. The transmit circuit 76 transmits a result of the sensor 72 via the antenna 80. The receive circuit 78 receives the instruction information via the antenna 80.

In this manner, the thermoelectric conversion device 100 of the first embodiment or the second embodiment is used as a power supply of the compound sensor device 82. Thus, electrical power used for the sensor 72 and a wireless transmission can be self-supported. And, a sensor node that is free of maintenance can be achieved.

In the third embodiment, a description is given of the example in which the thermoelectric conversion device is used for the compound sensor device. The thermoelectric conversion device of the first embodiment or the second embodiment may be used for another electronic device. For example, the electronic element to which electrical power is supplied from the thermoelectric conversion device may be other than the sensor 72.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A thermoelectric conversion device comprising:
   a thermoelectric conversion element in which a p-type thermoelectric material and an n-type thermoelectric material that are provided between an upper electrode and a lower electrode of the thermoelectric conversion element are alternately connected in series via the upper electrode and the lower electrode;
   an insulating layer that is provided between the upper electrode and the lower electrode and covers the p-type thermoelectric material and the n-type thermoelectric material; and
   an electric storage element that is provided between the upper electrode and the lower electrode and between the p-type thermoelectric material and the n-type thermoelectric material that are next to each other through one of the upper electrode and the lower electrode and is covered by the insulating layer.

2. The thermoelectric conversion device as claimed in claim 1, wherein the insulating layer has a cavity that is formed between the upper electrode and the lower electrode.

3. The thermoelectric conversion device as claimed in claim 2, wherein at least a part of the electric storage element is exposed to the cavity.

4. The thermoelectric conversion device as claimed in claim 2, wherein the insulating layer has a first insulating layer that has a flat face on which the electric storage element is mounted and a second insulating layer that is jointed to the flat face and has a face having a recess forming the cavity.

5. The thermoelectric conversion device as claimed in claim 1, wherein the electric storage element is a solid secondary cell.

6. The thermoelectric conversion device as claimed in claim 5, wherein the solid secondary cell is a solid lithium secondary cell that has a solid electrolyte.

7. The thermoelectric conversion device as claimed in claim 2, wherein the cavity is vacuum or is filled with an inert gas.

8. The thermoelectric conversion device as claimed in claim 1, wherein the electric storage element stores an electrical power generated by the thermoelectric conversion element.

9. The thermoelectric conversion device as claimed in claim 1, wherein the insulating layer has a cavity that is formed between the upper electrode and the lower electrode and between the p-type thermoelectric material and the n-type thermoelectric material that are next to each other through one of the upper electrode and the lower electrode, the cavity being separated from the p-type thermoelectric material and the n-type thermoelectric material by the insulating layer.

10. The thermoelectric conversion device as claimed in claim 2, wherein an upper surface and a side surface of the electric storage element are exposed to the cavity.

11. The thermoelectric conversion device as claimed in claim 1, wherein the electric storage element is provided in a plurality, and the electric storage elements are stacked in an extension direction of the p-type thermoelectric material and the n-type thermoelectric material.

12. The thermoelectric conversion device as claimed in claim 1, wherein the electric storage element is sealed by the insulating layer.

13. The thermoelectric conversion device as claimed in claim 1, wherein the electric storage element has through holes, and the p-type thermoelectric material and the n-type thermoelectric material penetrate the electric storage element via the through holes.

14. An electronic device comprising:
a thermoelectric conversion device; and
an electronic element to which an electrical power is supplied from the thermoelectric conversion device,
the thermoelectric conversion device including:
  a thermoelectric conversion element in which a p-type thermoelectric material and an n-type thermoelectric material that are provided between an upper electrode and a lower electrode of the thermoelectric conversion element are alternately connected in series via the upper electrode and the lower electrode;
  an insulating layer that is provided between the upper electrode and the lower electrode and covers the p-type thermoelectric material and the n-type thermoelectric material; and
  an electric storage element that is provided between the upper electrode and the lower electrode and between the p-type thermoelectric material and the n-type thermoelectric material that are next to each other through one of the upper electrode and the lower electrode and is covered by the insulating layer.

15. The electronic device as claimed in claim 14, wherein the electronic element is a sensor.

* * * * *